United States Patent
Tsyrganovich

[11] Patent Number: 6,009,445
[45] Date of Patent: Dec. 28, 1999

[54] RECONFIGURABLE INFINITE IMPULSE RESPONSE DIGITAL FILTER

[75] Inventor: Anatoliy V. Tsyrganovich, San Jose, Calif.

[73] Assignee: Zilog, Inc., Campbell, Calif.

[21] Appl. No.: 08/950,730

[22] Filed: Oct. 15, 1997

[51] Int. Cl.$^6$ .................................................. G06F 17/10
[52] U.S. Cl. ......................................... 708/300; 708/320
[58] Field of Search .................... 364/724.011, 724.012, 364/724.17, 724.19, 724.16; 708/300, 301, 719, 720, 721, 722

[56] References Cited

U.S. PATENT DOCUMENTS

| | | | |
|---|---|---|---|
| 4,422,156 | 12/1983 | Sano | 364/724.17 |
| 4,467,440 | 8/1984 | Sano | 364/724.17 |
| 4,489,391 | 12/1984 | Morikawa | 364/724.17 |
| 5,355,329 | 10/1994 | Lyon | 364/724.17 |
| 5,737,254 | 4/1998 | Lane et al. | 364/724.17 |

OTHER PUBLICATIONS

Whitaker, Jerry C.; "The Electronics Handbook"; A CRC Handbook Published in Cooperation with IEEE Press, Technical Press, Inc.; 1996; pp. 749–772.

*Primary Examiner*—Chuong Dinh Ngo
*Attorney, Agent, or Firm*—Majestic, Parsons, Siebert & Hsue

[57] ABSTRACT

A reconfigurable infinite impulse response low-pass filter is described in which the frequency response can be changed by changing a single parameter while the filter gain of the filter remains constant, preferably, unity. The parameter value is used to calculate the coefficients for the infinite impulse response filter. By choosing the parameter values carefully, the infinite impulse response filter can be implemented using shift registers rather than multipliers to reduce the hardware complexity of the infinite impulse response filter.

16 Claims, 5 Drawing Sheets

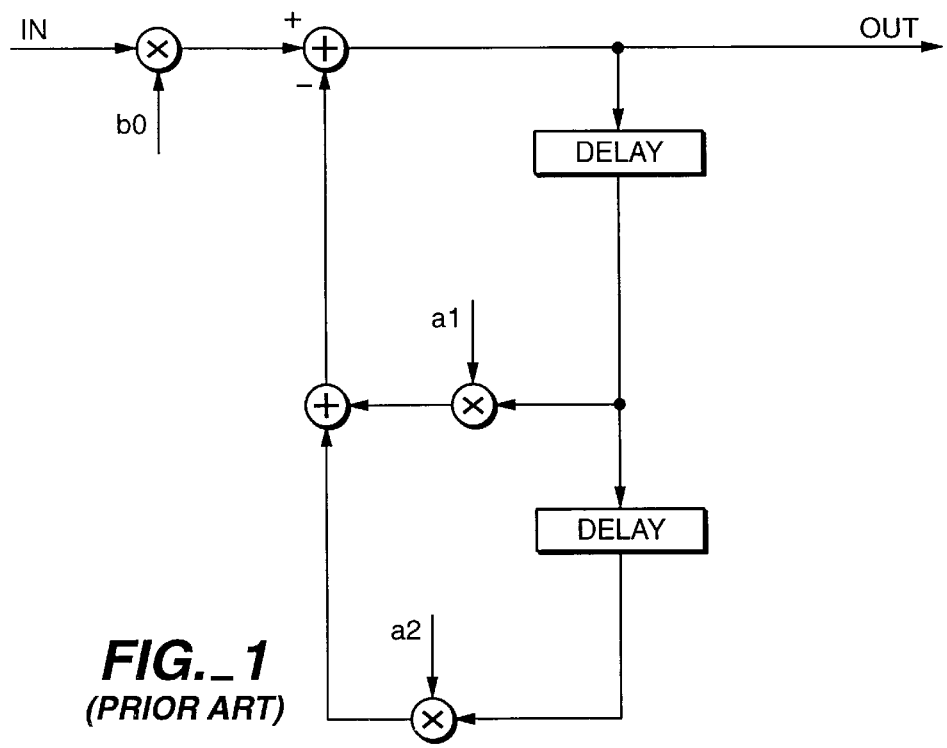
FIG._1
(PRIOR ART)
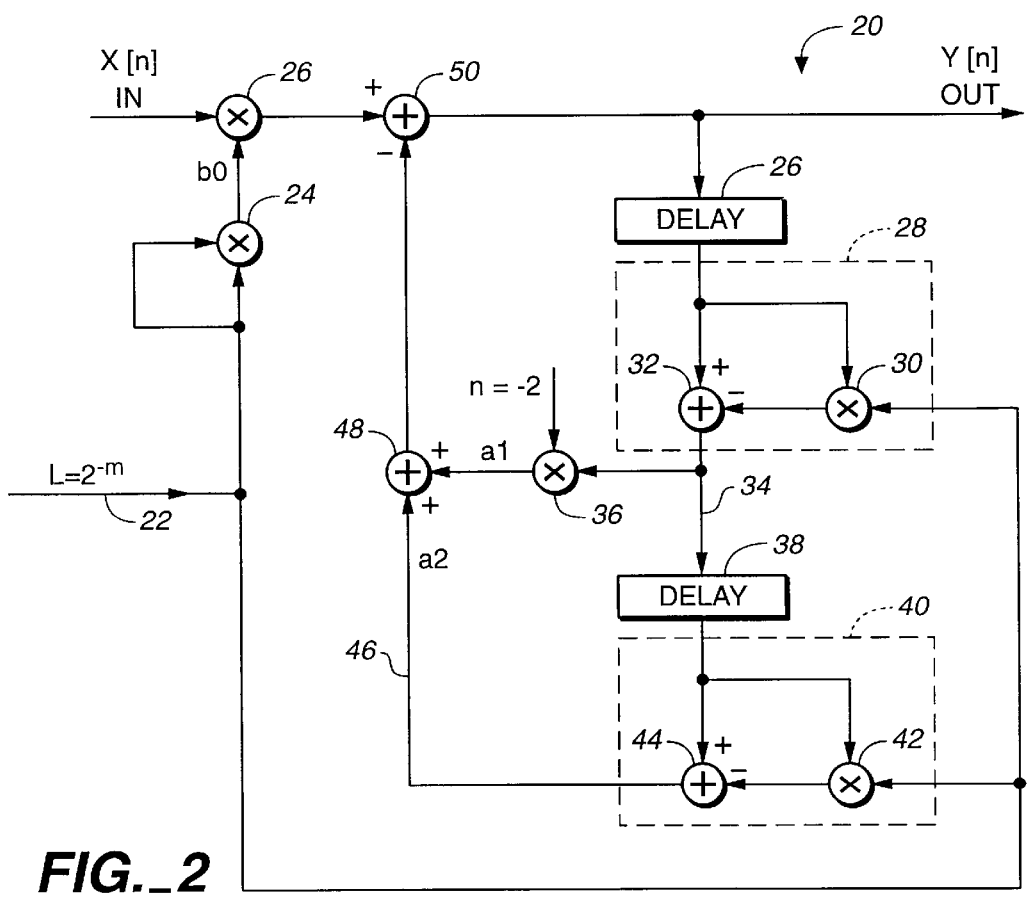
FIG._2

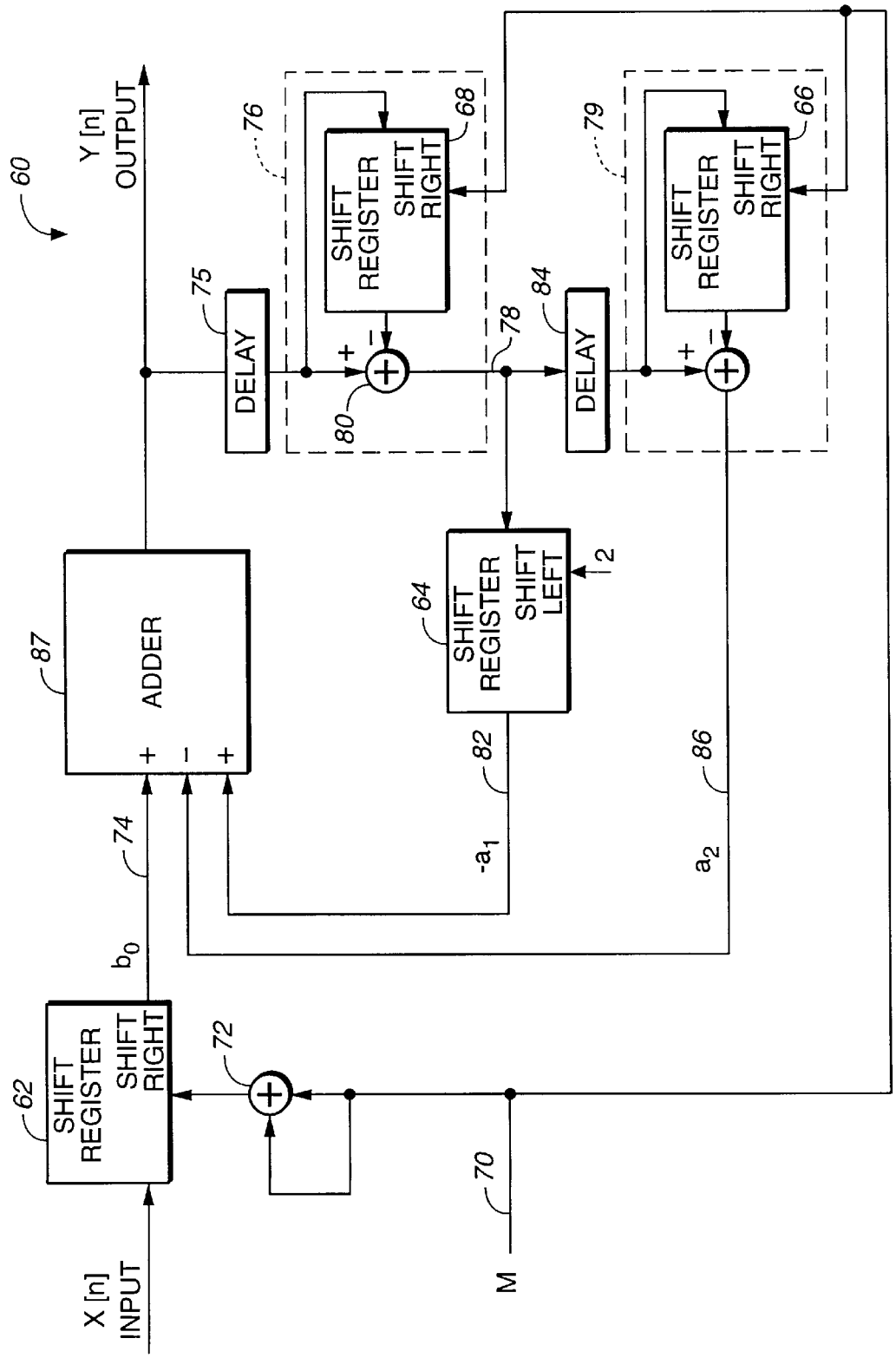
FIG._3

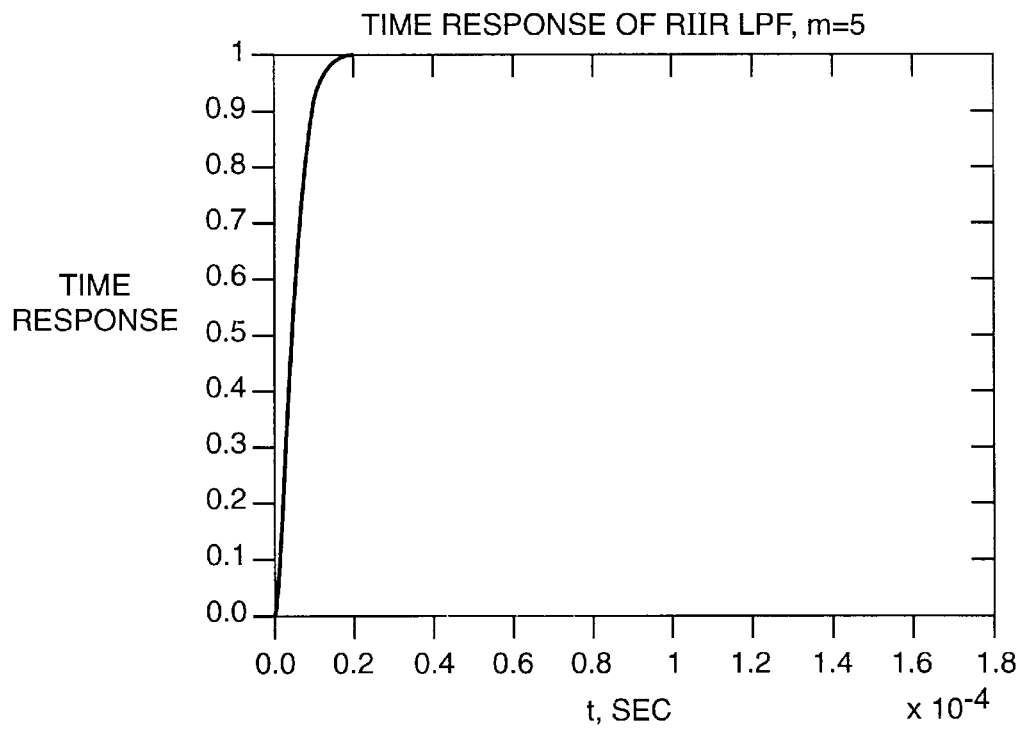
FIG._4A
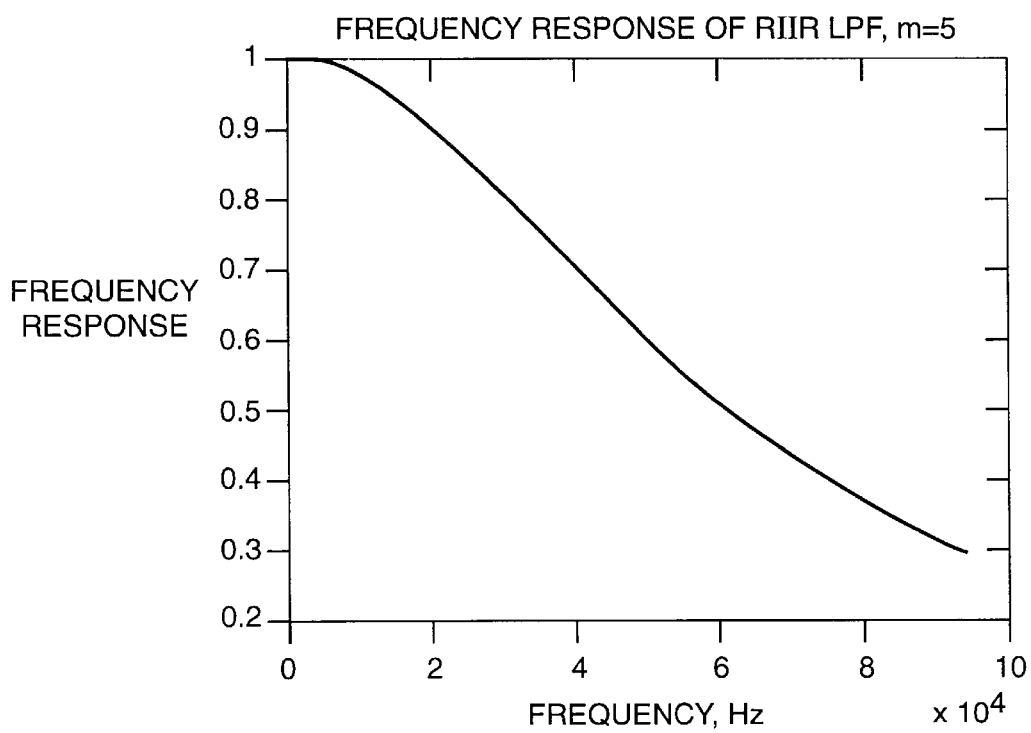
FIG._4B

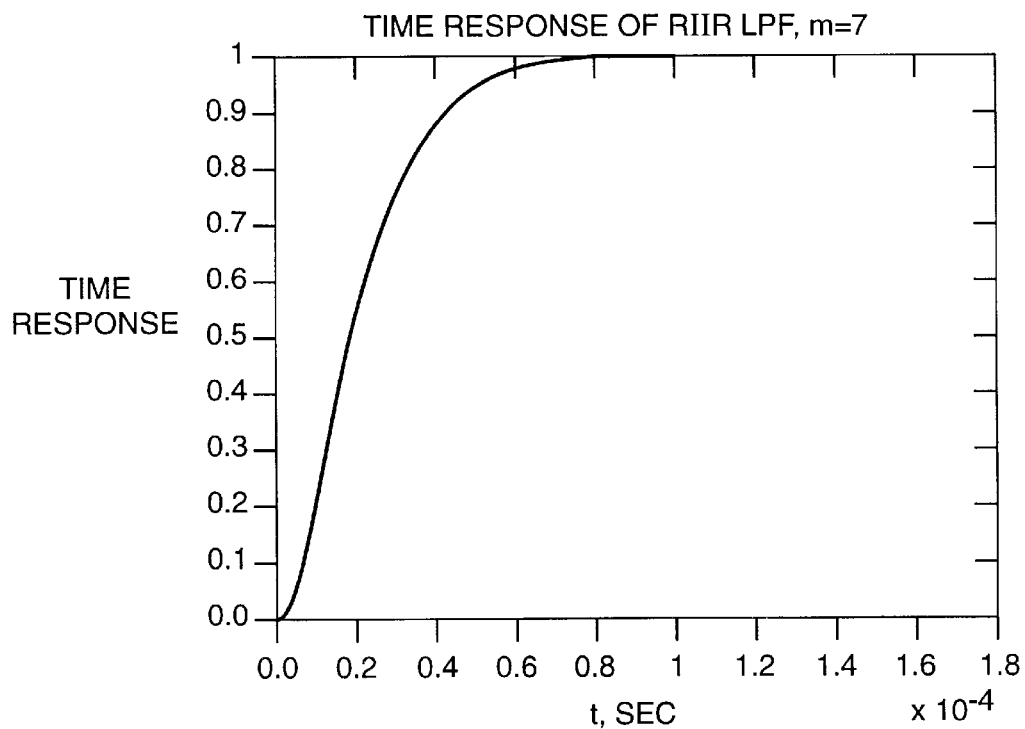
FIG._5A
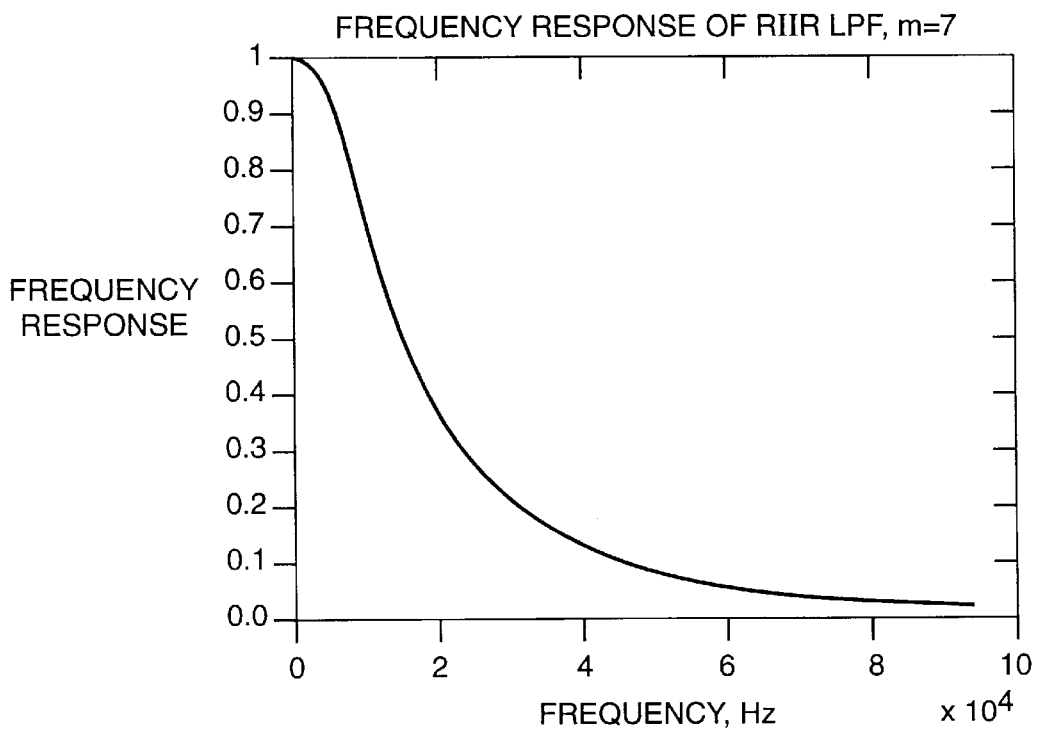
FIG._5B

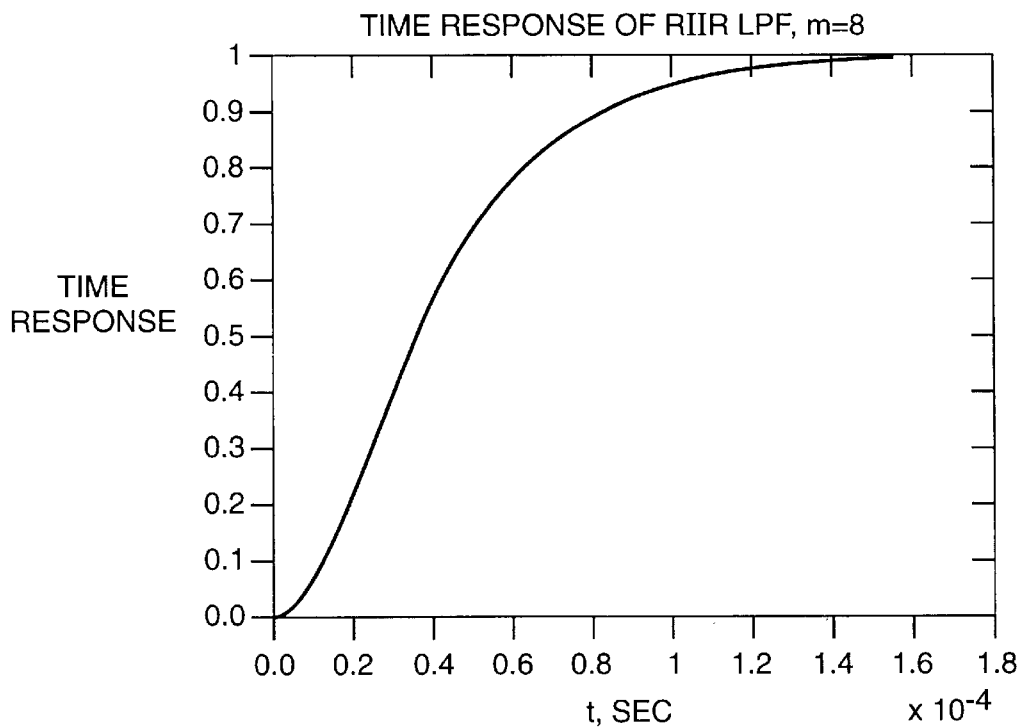
FIG._6A
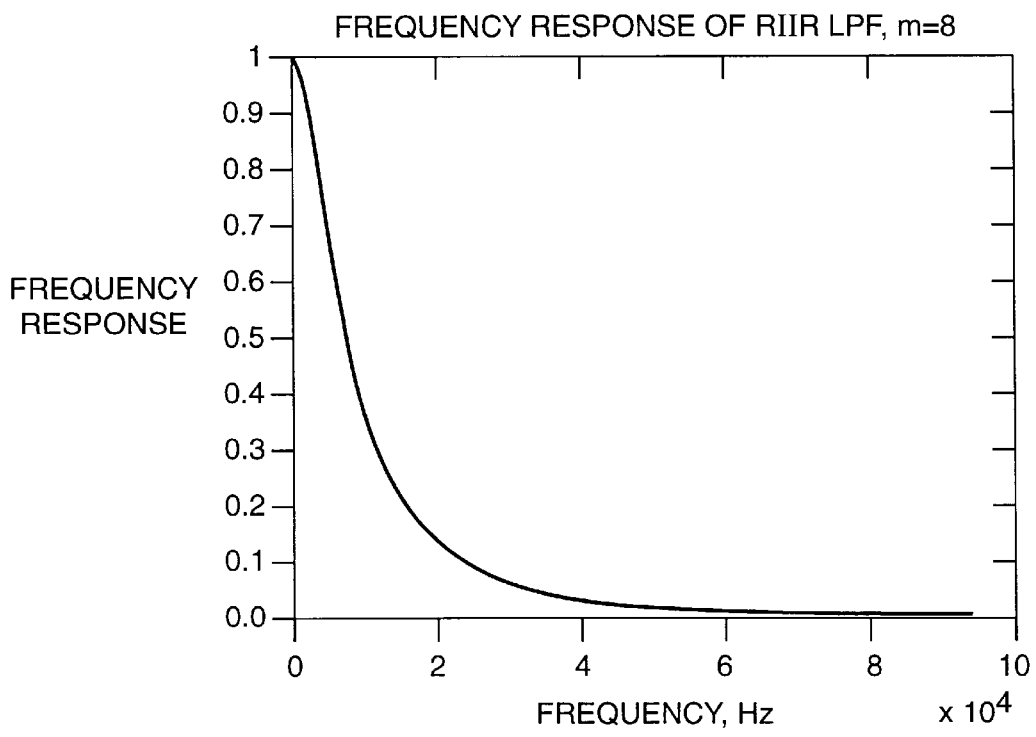
FIG._6B

RECONFIGURABLE INFINITE IMPULSE RESPONSE DIGITAL FILTER

BACKGROUND OF THE INVENTION

The present invention relates to digital infinite impulse response (IIR) filters. Infinite impulse response filters are filters with an impulse response that has an infinite length. Such an IIR filter can be built by feeding back the output into the filter.

An important class of infinite impulse response filters can be described by the difference equation $$y[n]=b_0x[n]+b_1x[n-1]+\ldots+b_M x[n-M]-a_1y[n-1]-a_2y[n-2]-\ldots-a_Ny[n-N]$$

where $X[n]$ is the input, $Y[n]$ is the output of the filter, and $[a_1, a_2 \ldots, a_N]$ and $[b_0, b_1 \ldots b_M]$ are real value coefficients. An example of such a filter is given in FIG. 1. FIG. 1 shows a second order filter which is given by the equation $$y[n]=b_0x[n]-a_1y[n-1]-a_2y[n-2]$$

This filter has three independent parameters $b_0$, $a_1$, $a_2$. If a reconfigurable filter is desired to have a stable gain, the coefficients must be carefully chosen to maintain this stable gain. For example, if either coefficient $a_1$, or $a_2$ is changed, coefficient $b_0$ should be modified to maintain a constant gain. It requires a lot of technical resources to store coefficients of such a reconfigurable system. Additionally, in order to maintain filter stability, the coefficients must be very accurately determined, since the filters can be sensitive to coefficient rounding errors.

Because of these limitations, it is desired to have an improved reconfigurable infinite impulse response filter.

SUMMARY OF THE INVENTION

The reconfigurable infinite impulse response filters of the present invention have an order greater than one and are arranged such that, when a single parameter is changed, the frequency response of the filter is modified, but the filter DC gain remains the same. A single parameter is used to calculate the different infinite impulse response filter coefficients. In this way, only the single parameter need be stored. Thus, storing and switching the coefficients is easily done by the system of the present invention.

In one preferred embodiment, the reconfigurable infinite impulse response filter has a unitary filter gain. Using a parameter L, the calculated coefficients are $b_0=L^2$; $a_1=-2(1-L)$; $a_2=(1-L)^2$.

In a preferred embodiment, the filter uses identical serial connection units in serial connection with the delay elements. The use of the serial connection units results in a lower rounding error sensitivity and has a high filter stability because of the method of calculating the coefficients. One of the preferred embodiment serial connection units multiplies the input by (1-L). Thus, when the serial connection units are connected in serial to the delay, the output of the first serial connection unit can be $(1-L)y[n-1]$. This interim value can be multiplied by −2 to produce the $a_1$ coefficient. The interim value is passed through another delay and serial connection unit to produce a value $(1-L)^2y[n-2]$, which is the $a_2$ coefficient.

Additionally, since most digital data is encoded using the binary system, when the parameter L is encoded as the value $2^{-m}$, the complexity of the filter can be reduced since six registers can be used instead of multipliers. This reduces the hardware complexity of the filter and can reduce coefficient rounding errors.

BRIEF DESCRIPTION OF THE DRAWINGS

The above and other features and aspects of the present invention will become more apparent upon reading the following detailed description in conjunction with the accompanying drawings.

FIG. 1 is a diagram of a prior art infinite impulse response digital filter.

FIG. 2 is a diagram of the infinite impulse response digital filter of the present invention.

FIG. 3 is a diagram illustrating the infinite impulse response digital filter of the present invention implemented with shift registers.

FIG. 4 is an illustration of the time and frequency response of the reconfigurable infinite impulse response filter of the present invention when m=5.

FIG. 5 is graphs of the time and figurative response of the reconfigurable infinite impulse response filter, of the present invention when m=7.

FIG. 6 is graphs of the time and frequency response of the reconfigurable infinite impulse response filter of the present invention when m=8.

DETAILED DESCRIPTION OF THE PREFERRED EMBODIMENT

FIG. 2 is a diagram of the reconfigurable infinite impulse response filter 20 of the present invention. In the infinite impulse response filter 20 of the present invention, parameter L is supplied on line 22. This parameter multiplies with itself in multiplier 24 to produce the coefficient $b_0$. This coefficient is multiplied by the input signal in the multiplier 26. The output signal is sent to delay 26 and through the serial connecting unit 28. The serial connecting unit 28 multiplies the input by (1-L) using multiplier 30 and subtractor 32. The serial connection unit 28 produces an interim value at 34 equal to $(1-L)y[n-1]$. The interim value is multiplied by −2 in multiplier 36 to produce the $a_1$ coefficient. Additionally, the interim value is sent through the delay into an additional serial connection unit 40. Serial connection unit 40 is in a preferred embodiment identical to that of serial connection unit 28. The serial connection unit 40 produces the $(1-L)^2y[n-2]$ value, which is the $a_2$ coefficient on line 46. The $a_1$ and $a_2$ components are added in adder 48 and then subtracted from the $b_0$ component in subtractor 50. The equation for the infinite impulse response filter 20 is given by $$y[n]=L^2x[n]+2(1-L)y[n-1]-(1-L)^2y[n-2]$$

Also, the filter gain of the reconfigurable infinite impulse response filter of the present invention is unity. Note that:

$$g = \frac{b_0}{1+a_1+a_2} = \frac{L^2}{1-2(1-L)+(1-L)^2} = 1$$

Multiple different frequency responses can be obtained by choosing different L parameter values. The filter will have the same unity gain, however. Thus, only the single L parameter value needs to be stored by the system, rather than a number of coefficient values.

In a preferred embodiment, the parameter values are set using the value $L=2^{-M}$. This has the advantage that, in most digital systems, data is stored in binary representation. By using a parameter that is a power of 2, the complexity of the filters can be reduced. This can best be shown in FIG. 3. FIG. 3 is an infinite impulse response filter of the present invention implemented using shift registers 62, 64, 66 and 68. In this embodiment, the single parameter m is supplied to the filter 60 on line 70. Adder 72 produces a 2m value that is supplied to shift the input values X[n] to n places to the right. This produces a value on line 74 equal to $2^{-2M}X[n]$. The "m" value is provided to serial connection units 76 and 79. The output of unit 76 at line 78 is the interim value of $(1-2^{-M})$ y[n−1]. The effect of the shift register 68 and subtractor 80 of the serial connection unit 76 is a multiplication of the unit's input by $(1-2^{-M})$. The interim value on line 78 is shifted two positions to the left using the shift register 64. Shift register 64 could be hardwired. The output of shift register 68 on line 82 is the value $2(1-2^{-M})y[n-1]$. The interim value on 78 is also passed to the delay 84 and sent to the serial connection unit 79. The serial connection unit 79 is preferably identical to the serial connection unit 76. The output of the serial connection unit 78 on line 86 is equal to $(1-2^{-M})^2 y[n-2]$. The circuit of FIG. 3 is a filter using the equation:

$$y[n]=2^{-2m}x[n]+2(1-2^{-m})y[n-1]-(1-2^{-m})^2y[n-2]$$

This system has a unity filter gain, but for different "m" values will produce different frequency responses.

By embodying the filter using shift registers rather than multipliers, the complexity of the filter is reduced. This may reduce some of the coefficient rounding errors as well. Additionally, the parameter "m" can be encoded using relatively few bits. This helps in the storing and processing of reconfigurable infinite impulse response filter.

The accuracy of filter transfer function can be increased by increasing the bit width. Both the stability of filter is provided by the single parameter $L_m$ and filter structure. The last provides unity gain and therefore stability of filter.

FIGS. 4–6 illustrate time and frequency responses for the reconfigurable infinite impulse response filters of the present invention. These figures were done using a clock frequency of 12 MHz. FIG. 4 illustrates the time and frequency responses when M=5. FIG. 5 illustrates the time and frequency responses when M=7. FIG. 8 illustrates the time and frequency responses when M=8. Note that a wide variety of frequency response curves can be produced by modifying the "m" parameter. The "m" parameter can be encoded in a relatively small number of bits (three bits for the examples of FIGS. 4–6). Thus, a variety of frequency response curves for filters can be obtained while maintaining the filter gain as unity. The reconfigurable infinite impulse response filter of the present invention thus can have uses in situations where a reconfigurable low-pass filter is desired. An example of an area where reconfigurable low-pass filters would be useful is in a phase lock loop circuit.

Various details of the implementation and method are merely illustrative of the invention. It will be understood that various changes in such details may be within the scope of the invention, which is to be limited only by the appended claims.

What is claimed is:

1. A reconfigurable infinite impulse response digital filter having a filter order greater than one, the filter having one or more delay elements, the filter having a single parameter input, the filter having one or more identical serial connection units whose output signal is dependent upon said single parameter input, wherein a number of said delay elements are connected with an equal number of said identical serial connection units to form serial delay/connection pairs such that each of said serial delay/connection pair comprises a delay element connected in line serially with a following identical serial connection unit, said serial connection unit of a delay/connection pair receiving a signal only from the delay element with which it is paired, said serial delay/connection pairs being arranged in line serially, the filter being such that the single parameter input has a number of parameter values such that the frequency response is different for different parameter values but the filter gain remains the same, wherein the filter is defined such that $y(n)=L^2 x(n)+2(1-L)y(n-1)-(1-L)^2 y(n-2)$, wherein x(n) is the input at n, y(n) is the output at n, and L is the parameter input.

2. A reconfigurable infinite impulse response digital filter having a filter order greater than one, the filter having one or more delay elements, the filter having a single parameter input, the filter having one or more identical serial connection units whose output signal is dependent upon said single parameter input, wherein a number of said delay elements are connected with an equal number of said identical serial connection units to form serial delay/connection pairs such that each of said serial delay/connection pair comprises a delay element connected in line serially with a following identical serial connection unit, said serial connection unit of a delay/connection pair receiving a signal only from the delay element with which it is paired, said serial delay/connection pairs being arranged in line serially, the filter being such that the single parameter input has a number of parameter values such that the frequency response is different for different parameter values but the filter gain remains the same, wherein the parameter values are arranged such that said parameter input is equal to $2^{-m}$ where m is a positive integer value, and wherein the filter is defined such that $y(n)=2^{-2m}x(n)+2(1-2^{-m})y(n-1)-(1-2^{-m})^2 y(n-2)$, wherein x(n) is the input at n and y(n) is the output at n.

3. A reconfigurable infinite impulse response digital filter having a filter order greater than one, the filter having a number of delay elements, wherein there are at least two delay elements and wherein there are two identical serial connection units in line serially with the delay elements, the filter having a single parameter input, wherein the serial connection units produce a unit output signal that is (1-L) times a unit input signal where L is the input parameter value, the filter being such that the single parameter input has a number of parameter values such that the frequency response is different for different parameter values but the filter gain remains the same.

4. A method of filtering an input signal comprising:
providing a reconfigurable infinite impulse response digital filter having a filter order greater than one, the filter having a single parameter input, wherein the filter is defined such that $y(n)=L^2 x(n)+2(1-L)y(n-1)-(1-L)^2 y(n-2)$, wherein x(n) is the input at n and, y(n) is the output at n, and L is the parameter input;

inputting a first parameter value into the parameter input such that the filter has a first frequency response and a predetermined gain; and thereafter, inputting a second parameter value into the parameter input such that the filter has a second frequency response different than the first frequency response but has the same predetermined gain.

5. A method of filtering an input signal comprising:
providing a reconfigurable infinite impulse response digital filter having a filter order greater than one, the filter having a single parameter input, wherein the filter is defined such that $y(n)=2^{-2m}x(n)+2(1-2^{-m})y(n-1)-(1-2^{-m})^2 y(n-2)$, wherein x(n) is the input at n, y(n) is the output at n, and m is the parameter input;

inputting a first parameter value into the parameter input such that the filter has a first frequency response and a predetermined gain; and thereafter, inputting a second parameter value into the parameter input such that the filter has a second frequency response different than the first frequency response but has the same predetermined gain.

6. A reconfigurable infinite impulse response digital filter having a filter order greater than one, the filter having a single input parameter, L, the filter being defined such that $y(n)=L^2 x(n)+2(1-L)\, y(n-1)-(1-L)^2\, y(n-2)$, wherein $x(n)$ is the input at n and, $y(n)$ is the output at n, so that the filter being such that the single input parameter can have a number of parameter values such that the frequency response is different but the filter gain is unity.

7. The reconfigurable infinite impulse response digital filter of claim 6, wherein the filter is a reconfigurable low pass filter.

8. The reconfigurable infinite impulse response digital filter of claim 6, wherein the filter is a part of a phase locked loop circuit.

9. The reconfigurable infinite impulse response digital filter of claim 6, wherein there are at least two delay elements and wherein there are two identical serial connection units in line serially with the delay elements.

10. The reconfigurable infinite impulse response digital filter of claim 6, wherein the serial connection units produce a unit ouput signal that is (1-L) times a unit input signal.

11. A reconfigurable infinite impulse response digital filter having a filter order greater than one, the filter having a single input parameter, m, wherein m is a positive integer value, the filter being defined such that $y(n)=2^{-2m}x(n)+2(1-2^{-m})y(n-1) -(1-2^{-m})^2 y(n-2)$, wherein $x(n)$ is the input at n and $y(n)$ is the output at n, so that the filter being such that the single input parameter can have a number of parameter values such that the frequency response is different but the filter gain is unity.

12. The reconfigurable infinite impulse response digital filter of claim 11, wherein the filter is implemented with shift registers.

13. The reconfigurable infinite impulse response digital filter of claim 12, wherein the filter includes a first shift register to shift the input value 2 m to right.

14. The reconfigurable infinite impulse response digital filter of claim 13, wherein the filter includes a circuit to produce a once delayed output and to subtract from the once delayed output a value equal to the once-delayed output shifted to the right by m in a second shift register to produce an interim value, the circuit including a shift register to shift the interim value once to the left in a third shift register.

15. The reconfigurable infinite impulse response digital filter of claim 13, wherein the filter includes another circuit to produce a delayed interim value and to subtract from the delayed interim value a value equal to the delayed interim value shifted to the right by m in a forth shift register.

16. A method of filtering an input signal comprising:
providing a reconfigurable infinite impulse response digital filter having a filter order greater than one, the filter having a single parameter input, wherein the filter is defined such that $y(n)=L^2 x(n)+2(1-L)y(n-1)-(1-L)^2 y(n-2)$, wherein $x(n)$ is the input at n and, $y(n)$ is the output at n, and L is a function of the parameter input;
inputting a first parameter value into the parameter input such that the filter has a first frequency response and a predetermined gain; and
thereafter, inputting a second parameter value into the parameter input such that the filter has a second frequency response different than the first frequency response but has the same predetermined gain.

\* \* \* \* \*